United States Patent [19]

Kaeriyama

[11] Patent Number: 5,804,034
[45] Date of Patent: Sep. 8, 1998

[54] METHOD FOR MANUFACTURING SEMICONDUCTOR DEVICE

[75] Inventor: Toshiyuki Kaeriyama, Ibaraki-ken, Japan

[73] Assignee: Texas Instruments Incorporated, Dallas, Tex.

[21] Appl. No.: 210,964

[22] Filed: Mar. 21, 1994

[51] Int. Cl.$^6$ .............................................. H01L 21/3065
[52] U.S. Cl. .................................. 156/662.1; 156/653.1; 156/638.1; 216/62
[58] Field of Search ............................ 156/662.1, 643.1, 156/653.1, 651.1, 652.1, 638.1, 635.1; 252/79.1; 216/62

[56] References Cited

U.S. PATENT DOCUMENTS 3,841,904 10/1974 Chiang ...................................... 117/200
4,582,624 4/1986 Enjo et al. .............................. 252/79.4

OTHER PUBLICATIONS

"Influence of Cin On The Native Oxide Growth of Si"; J. Appl. Phys. (USA), vol. 69, No. 11, Graf et al., Jun. 1991', pp. 7620–7626.

"Surface Chemical Cleaning and Passivation For Semiconductor Processing", Symposium, Material Research Soc., Xi+518 pp., 1993, Bedge et. al., abstract only.

"Radiochemical Study of Semiconductor Surface Contamination, II. Deposition of Trace Impurities on Silicon and Silica", Kern, RCA Lab Rev (1970), 31(2), abstract only.

Primary Examiner—R. Bruce Breneman
Assistant Examiner—George Goudreau
Attorney, Agent, or Firm—Richard L. Donaldson; William B. Kempler

[57] ABSTRACT

A method for attaining a uniform roughening of a silicon semiconductor surface with a microscopic amount of roughness at the Å level, wherein the amount of roughness may be accurately and precisely controlled without complicating the manufacturing processes and increasing the manufacturing cost, and regardless of the shape of the silicon surface area of the substrate. The substrate with the silicon surface area is immersed in a cleansing solution, such as SC1 for example, containing a metallic substance, such as Fe, Ni, Cu, Zn, Al, and Cr, for example, at the ppb level to wash the surface. Then, a silicon oxide film uniformly containing the metallic substance is formed on the silicon surface of the substrate after drying, and isotropic etching is performed on the surface of the substrate formed with the silicon oxide film by etching Si from the silicon oxide film at a high ratio of selectivity to form microscopic irregularities. This procedure increases the effective surface area of the silicon surface in a highly precise manner and can be employed in making trench type or stack type DRAM memory cell structures.

12 Claims, 5 Drawing Sheets

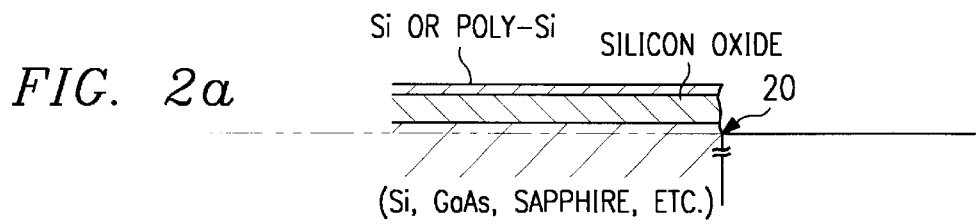
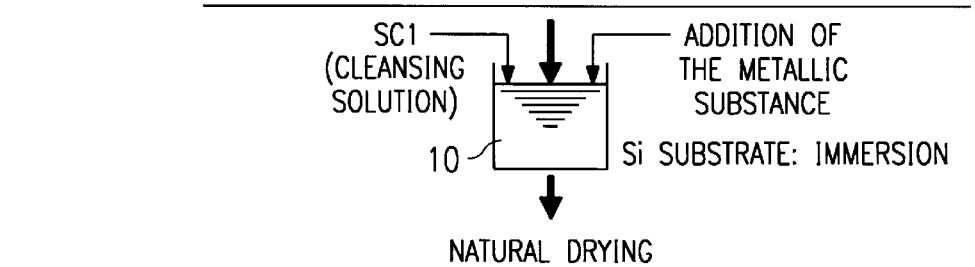
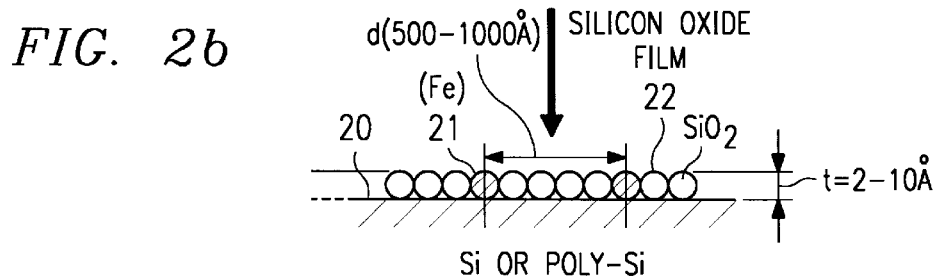
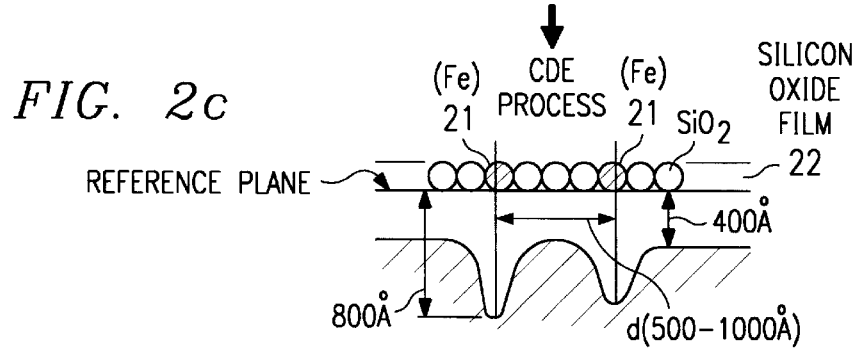
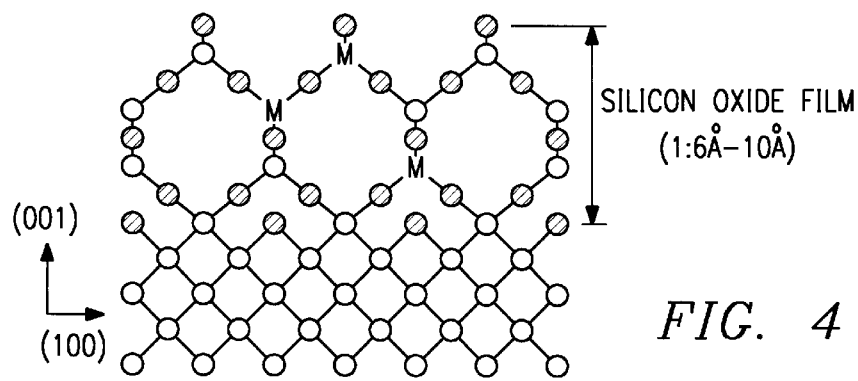

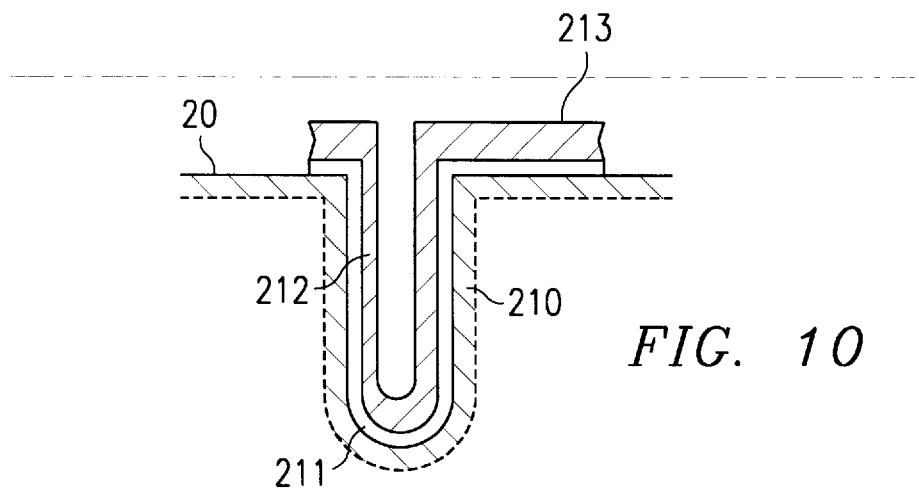
FIG. 10
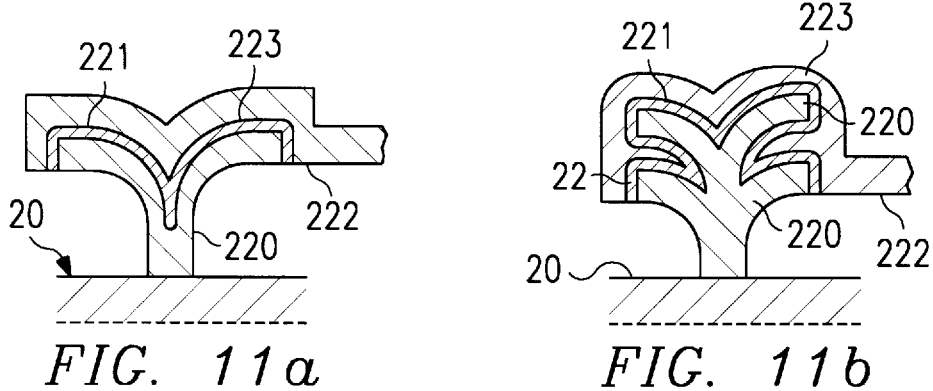
FIG. 11a
FIG. 11b
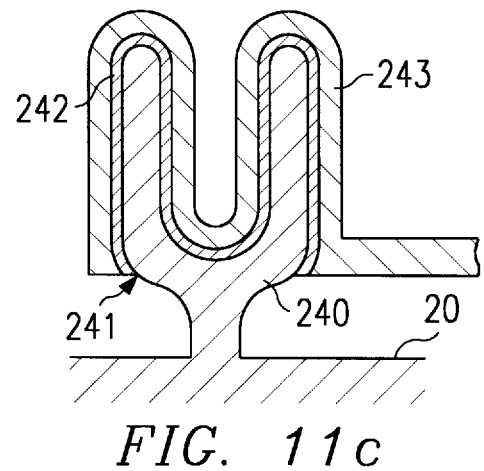
FIG. 11c

METHOD FOR MANUFACTURING SEMICONDUCTOR DEVICE

This invention concerns a method for manufacturing a semiconductor device, and more precisely, a manufacturing method for attaining an increase in the capacity area of a 1 transistor and 1 capacitor type memory cell for a DRAM (dynamic random access memory).

BACKGROUND OF THE INVENTION

As is publicly known, tremendous advancement has been made in the high integration and densification of DRAMs, and there is presently a further shift to chips of between 4M(mega)bit and 16 Mbit, and further to between 64Mbit and 256Mbit. As high integration advances in this way, the field of element formation in a planar type cell structure, in which a transistor and capacitor are arranged on top of a semiconductor circuitry forming surface, becomes insufficient and does not meet the requirements when contrasted with the area designed for the chip. Therefore, a stack type cell structure, in which capacitors are laminated to insure the capacity value within a certain area, or a trench type cell structure, in which a trench is formed in the silicon substrate so that the walls are used as the capacitor, are presently occupying mainstream technology. In the trench type cell structure, a trench is formed in a monocrystalline silicon substrate, a thin dielectric layer is formed on the trench walls, and a polycrystalline silicon plate layer is then formed on top. In the stack type cell structure, a fin-shaped electrode, which is used as the capacitor in the circuitry formation section, is formed of polycrystalline silicon, a thin dielectric layer is formed on the surface of the fin, and a polycrystalline silicon plate layer, which is used as the counter electrode, is then formed on top.

As described previously, as high integration in DRAMs advances, a reduction in the basic structure is inevitably required, which as a result gradually reduces the area for a memory unit cell. However, it is necessary to maintain the volume of the capacitor regardless of the reduction in the basic structure in order to maintain the reliability of the DRAM and the reliability of memory performance; therefore, further reduction is not possible. To cope with this problem at present, methods have been adopted to increase the surface area of the cell, in which the trench in the silicon substrate is carved deeper in the trench type cell structure, and the number of fins, which is one circuitry formation element and which is used as the electrode in the capacitor, is increased in the stack type cell structure, for example. A further approach would be the use of a method in which the film thickness of the dielectric layer is made thinner, for example.

As a result, problems occur, such as complications in the manufacturing process of the DRAM, which depends on microprocessing technology at the micron scale, difficulties accompanying the realization of mass production, and, furthermore, a drastic increase in the manufacturing cost, for example.

It is an object of this invention to attain an uniform roughness of the target element formation surface with a microscopic roughening amount at the Å (angstrom) level, and also to accurately and precisely control the roughening amount so that a highly precise microscopic surface area enlargement process can be employed to make the trench type or stack type DRAM cell structure, for example, without complicating the manufacturing process and increasing the manufacturing cost, and regardless of the shape of the element formation area.

SUMMARY OF THE INVENTION

In accordance with the invention, a manufacturing method is provided that involves a process in which a substrate which has a Si film or Si layer on its surface area is immersed in a cleansing solution containing metallic substances, such as Fe, Ni, Cu, Zn, Al, Cr, etc., for example, at the ppb level to wash the surface. A silicon oxide film containing uniform metallic substances is then formed on the surface of the Si layer after drying, and isotropic etching is performed on the surface of the Si layer with the silicon oxide film by etching Si from the silicon oxide film at a high ratio of selectivity to form microscopic irregularities. The amount of metallic substances added is selected and established in a range that is ideal between 0.1–1000. The silicon oxide film containing metallic substances is formed on the surface of the Si layer at a film thickness of 2–10Å. The etching process for the surface of the Si layer is preferably attained by an isotropic CDE (chemical dry etching) with $CF_4$ (carbon tetrafluoride), which barely detects the Si film or Si layer, and $O_2$ gas, or chlorine wet etching. However, other anisotropic etching processes can also be used if Si has a high selectivity over the silicon oxide film. Both dry and wet etchings can be used if the same processes can be repeated. As a substrate, Si, GaAs, or sapphire, for example, can be used. The Si film or Si layer on the surface is not limited to a monocrystalline type, and polycrystalline (poly-Si) and noncrystalline types can also be used. If an Si substrate is employed, the process may be performed directly on the surface thereof.

A substrate having an Si film or layer, immersed in a cleansing solution containing metallic substances and dried naturally, has a uniform deposition of metallic substances on its surface. A silicon oxide film, containing a uniform amount of metallic substances, is then formed on the surface of the Si layer by natural drying. The film thickness is in the range of between 2–10Å. The amount of metallic deposition on the surface of the Si layer can be accurately controlled by properly selecting the type of cleaning solution from SC1 ($NH_4OH:H_2O_2$: $H_2O$), SC2 (HCl: $H_2O_2$: $H_2O$), HF (hydrofluoric acid), BHF (buffered hydrofluoric acid) or PR1 ($H_2SO_4:H_2O_2$), for example, and also by properly selecting the type of metallic substances which are to be added to it, from Fe, Ni, Cu, Al, Cr, etc., for example, as well as properly and microscopically controlling and adjusting the amount added at the ppb level. Accurate control in the range of between $10^3$–$10^{13}$ atoms/cm$^2$, for example, can be attained.

Si on the surface of the Si layer, formed with a silicon oxide film, is etched from the silicon oxide film at a highly selective rate. Metallic substances, which are evenly contained in the silicon oxide film, increase the etching speed peripherally in the etching process during isotropic etching, such as CDE or chlorine, for example. Etching begins from the area of metallic substances because direct bonds of the metallic substances in the silicon oxide film and Si and bonds of metallic substances and Si with oxygen atoms can be easily broken during etching. Etching of the silicon oxide film stops when Si at the lower section of the metallic substances is etched to a certain point. Si at the lower section of the silicon oxide film then begins receiving etching after a time lag. As a result, etching advances for a certain period of time, and the etched Si surface is evenly formed with microscopic irregularities at the Å level and roughened to the point where the oxide film is fully etched off. This surface roughening, being the amount of roughening, is proportional to the amount of metallic substances on the surface of the Si layer, and the amount can be precisely controlled at an accurate and microscopic value by controlling the amount of metallic substances.

BRIEF DESCRIPTION OF THE DRAWINGS

FIG. 2 is a process diagram illustrating sequences of the method in accordance with the invention.

FIG. 4 is a graphic diagram indicating a state of the surface of the Si layer or film after cleansing using an atomic model.

FIG. 10 is a cross-sectional view showing a trench type memory cell structure in which the manufacturing method in accordance with the invention was employed.

FIGS. 11(a),(b), and (c) respectively show cross-sectional views of stack type memory cell structures in which the manufacturing method in accordance with the invention was employed.

In reference numerals as shown in the drawings:

20 is a Si film or layer, 21 is a metallic substance, 22 is a silicon oxide film, t is the film thickness, d is the depth of metallic deposition, 24 is the etching surface, and 25 are the irregularities.

DESCRIPTION OF PREFERRED EMBODIMENTS

Figure 1:
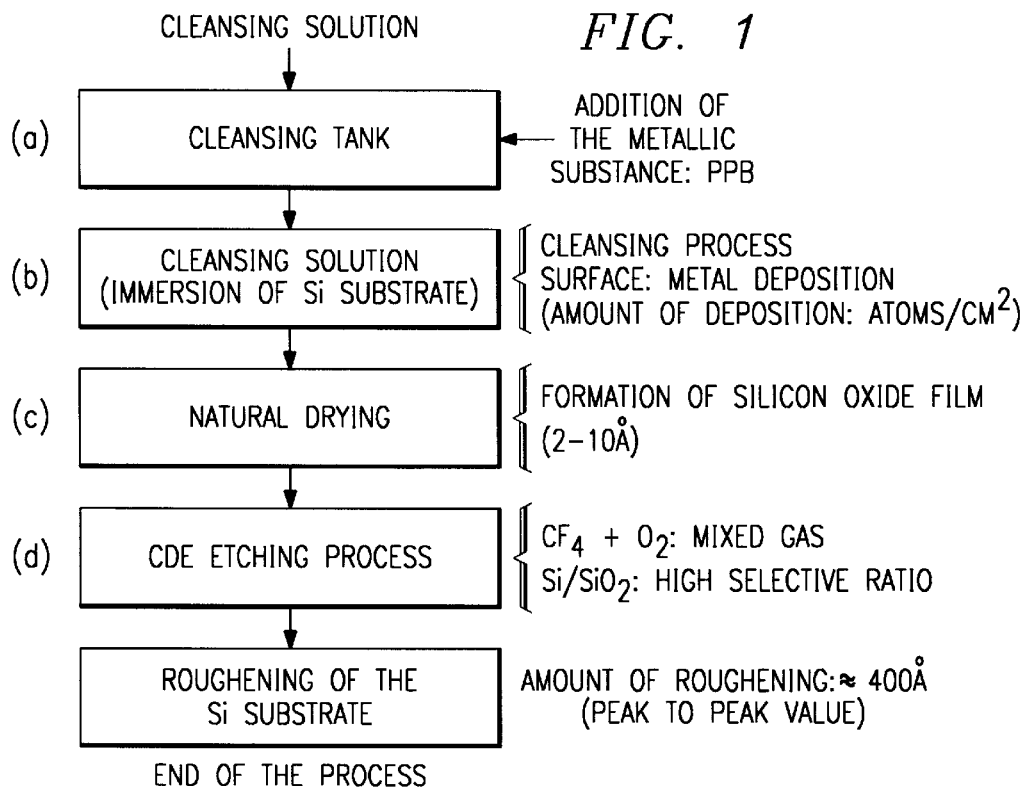
FIG. 1 is a flow chart illustrating a manufacturing method in accordance with the invention.

FIGS. 1 and 2 illustrate the manufacturing method of this invention. A cleansing solution is pre-stored in a cleansing tank 10. SC1 is used as the cleansing solution in a first embodiment; however, other cleansing solutions, such as HF, BHF, SC2, and PR1, for example, can also be used. One that is optimum can be selected from the above.

As indicted in FIG. 1(a), metallic substances (atoms) are added to the cleansing solution SC1 at the ppb (part per billion) level. As the metallic substances, Fe, Ni, Cu, Zn, Cr, Al, Sn, for example, or Ca, Na, K, Mg, for example, or Ag, Au, Pt, Hg, for example, can be employed. One of these, Fe, is selected in the first embodiment. As the addition amount, an optimum value in the range of 0.1–1000 ppb is selected.

Next, as indicated in FIG. 1(b), a substrate having an Si layer or film 20 is immersed in the cleansing solution (SC1). The entire surface of the substrate is cleansed chemically by immersing the Si layer 20, at which time the metallic substance Fe which is added to the cleansing solution is uniformly deposited on the Si film or Si layer on the surface area. The amount of the metallic substance Fe deposited on the surface of the Si layer 20 is at a value in the range of between $10^3$–$10^{13}$ atoms/cm$^2$, for example. An actual value of $10^{11}$–$10^{13}$ atoms/cm$^2$ is confirmed as the amount of the metallic substances Fe deposited. The substrate with the Si layer 20 is removed from the solution after cleansing, and dried naturally in a drying process indicated in FIG. 1(c). As a result, as indicated in FIG. 2(b), the metallic substance 21, etc., is uniformly and evenly deposited on the surface of the Si layer 20, and the silicon oxide film 22, which evenly contains the metallic substance 21, etc., and its oxide, is also formed on the surface of the substrate. The thickness (t) of the silicon oxide film 22 increases to a range of 2 Å and 10 Å when left in air for approximately 6 days. The distance d for embedding the metallic substance 21, etc., in the silicon oxide film 22 is 500–1000 Å.

FIG. 4 indicates an atomic model of the condition of the surface of the Si layer 20 observed at crystal face 100 immediately after cleansing with a cleansing solution containing hydrogen peroxide ($H_2O_2$), such as SC1, for example. The thickness (t) of the silicon oxide film 22 is between 6–10 Å. The condition in which the deposited metallic atoms M have changed into oxides and are indirectly bonded with the Si atoms, and the state where the silicon oxides have coupled with oxides of the metallic atoms and the Si atoms to form the silicon oxide film 22 containing uniform metallic atoms M on top of the crystal face of the Si (100), can be observed well.

Figure 5:
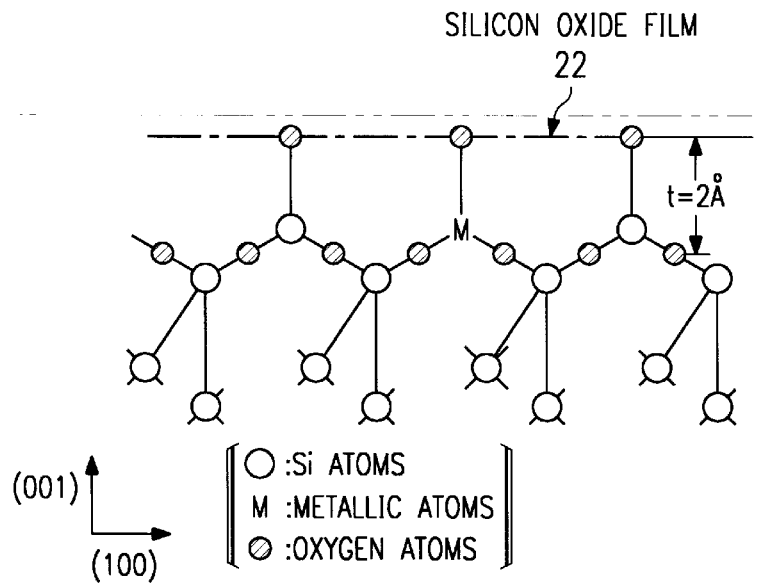
FIG. 5 is a graphic diagram indicating a model of the silicon oxide film estimated to form on the surface of the substrate when naturally dried after cleansing.

FIG. 5 indicates a model of an estimated formation in a natural oxidized state observed at the crystal face of Si (100) after the Si layer 20 is cleansed with HF, BHF, for example, and left in air. The silicon oxide film 22 is formed in a thickness of 2 Å. Oxides of the metallic atoms M are contained in the silicon oxide film 22.

Figure 6:
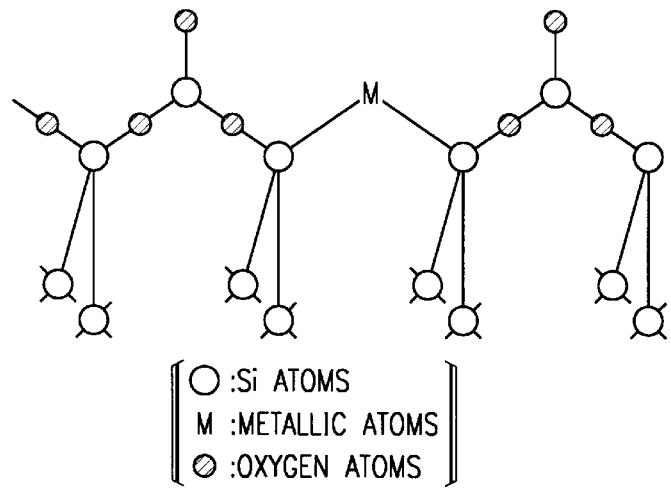
FIG. 6 is a graphic diagram indicating a model of the silicon oxide film estimated to form as in FIG. 5.

Furthermore, FIG. 6 indicates a model of an estimated formation on a silicon oxide film in a natural oxidation state observed at the crystal face of Si (100) as in FIG. 5. In this case, the metallic atoms M are not easily oxidized and a state is indicated in which they are directly bonded to the Si atoms. A model after an immediate washing with a solution containing $H_2O_2$, such as SC1, for example, is indicated in FIG. 4, and the formation of the silicon oxide film during the cleaning process in this case yields a film thickness of 10 Å. In the cases indicated in FIGS. 5 and 6, the film thickness (t) displays a step-like formation of 2 Å, 4 Å, 6 Å, and 8 Å by leaving the silicon surface without the silicon oxide film right after washing of HF, BHF, etc., in the air for 6 days.

The surface of the Si layer 20 is etched in the process in FIG. 1(d) after the formation of the silicon oxide film 22 in the manner described above. An isotropic etching, CDE, for example, in which Si is etched from the silicon oxide film at a highly selective rate, is used in this etching process.

Figure 3:
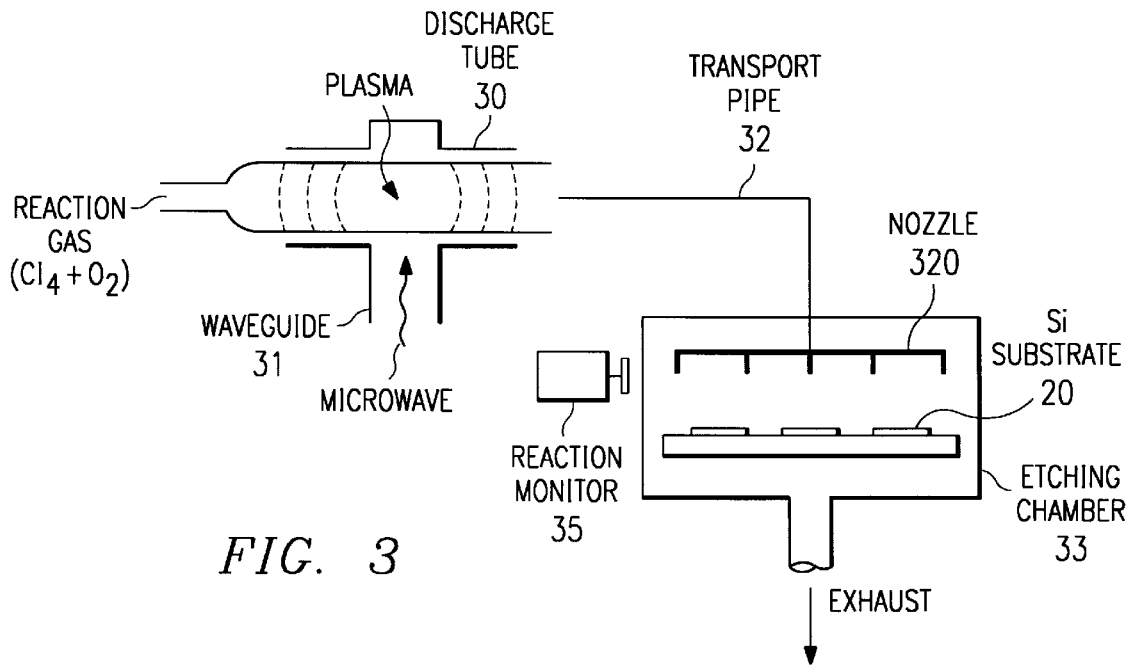
FIG. 3 is a schematic diagram illustrating a CDE system in which the manufacturing method of this invention may be employed.

One example of said CDE system is indicated in FIG. 3, where the central area of a discharge tube 30 is placed through a waveguide 31. A mixed gas of $CF_4$ and $O_2$ is supplied from one entrance of the side of the discharge tube 30. The discharge tube 30 is connected to an etching chamber 33 by a transport pipe 32. A nozzle 320 is equipped at the end of the etching chamber 33 where the transport pipe 32 is inserted. The mixed gas supplied to the discharge tube 30 receives microwave irradiation and enters the plasma state at the area within the waveguide pipe 31. Active gas provided for etching is generated in this plasma. This active gas is supplied to the etching chamber 33 by the transport pipe 32 and is coated uniformly over the surface of the substrates having Si layers 20, arranged horizontally and in parallel, through the nozzle 320. The surface of the Si layer and the active gas have a chemical reaction, volatile reaction products are generated and exhausted, and the Si and silicon oxide film is removed from the Si layer The surface of the Si layer 20 is etched in this manner. A luminous phenomenon occurring from chemiluminescence during etching is observed by a reaction monitor 35, which detects the end of etching, identifies the endpoint and terminates the processes. This is an outline of the operations at the CDE system where a mixed gas of $CF_4$ and $O_2$ is used in etching of the Si layer.

The CDE processes in this manufacturing method will be explained next.

When isotropic etching is performed using a mixed gas of $CF_4$ and $O_2$ with CDE and using the device in FIG. 3 in the process of FIG. 1(d), F (fluorine) atoms, which easily break the bonds of metal and Si, stop the bonding. Si is etched from the silicon oxide film at a high rate of selectivity and isotropic etching begins from an area of the metallic substance (Fe) 21, etc., contained in the silicon oxide film 22, the silicon oxide 22 is etched off after Si at a lower section of the metallic substance (Fe) 21 etc., is etched to a certain point, and Si at the lower area of the silicon oxide film 22 begins receiving etching after a time lag. As a result, the surface of the Si layer 20 is etched to a certain depth, approximately 400 Å deep, as indicated in the numeric example shown in the figure, after etching for a certain period of time, as indicated in FIG. 2(c). At the same time, microscopic irregularities 25, etc., with roughness at the Å level are evenly formed on this etched face 24. The roughness of these irregularities 25 etc., at a peak to peak value is approximately 400 Å in the numeric example shown in the figure. Trough areas in the irregularities 25 nearly correspond to the deposited areas of the metallic substance (Fe) 21. The distance d between adjoining troughs is 500–1000 Å. In the manner described above, the surface of the Si layer 20 is evenly roughened with microscopic irregularities 25, etc., at an Å scale. The surface area of the Si layer on the substrate increases through this roughening described above. When this enlargement process is adapted to a trench type or stack type memory cell structure, the surface area can be enlarged dramatically when compared to one without an enlargement of the cell structure of the same size, and the capacity volume can also be increased accordingly.

The etching process of the surface of the Si layer is not restricted to CDE. Any process in which Si is etched from the silicon oxide film at a high rate of selectivity can be used, and chlorine wet etching is also possible. Without being limited to isotropic etching, anisotropic etching can also be adopted if the same high selectivity rate is displayed.

EXAMPLE 1

Figure 7:
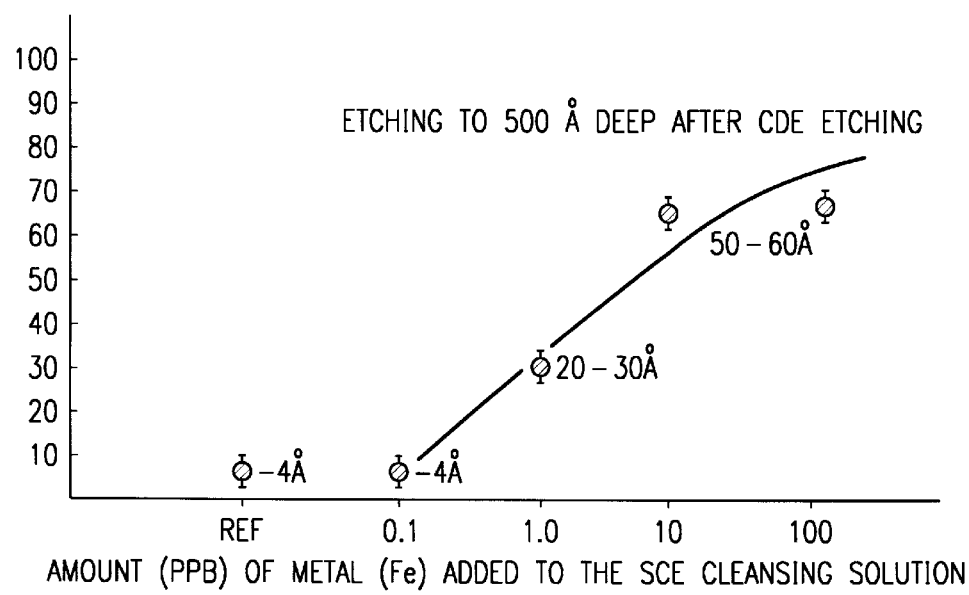
FIG. 7 is a graphic diagram indicating the relationship between the average roughness of the surface of the Si layer and the amount of metal added.

FIG. 7 is a graph showing the relationship between the average roughness Ra (Å) of the Si layer and the amount of metallic substance added in the cleansing solution, which is the amount of metallic deposition. Results of measurement on the surface of the Si layer after etching the Si layer to a depth of 500 Å by CDE are indicated. SC1 is used as the cleansing solution, and Fe is also used as the metallic substance.

In a REF (a chemical available on the market which is composed of SC1, the total amount of metal contained is at a level of 10–100 ppt) of average roughness RA, the ppt is $10^{-12}$ [sic] when the amount of Fe (metallic substance) added to the cleansing solution SC1 is 0.1 ppb. However, when the amount of Fe added exceeded 1.0 ppb, the surface roughness Ra increased almost linearly, and increases in the values were observed at Ra =20–30 Å at 1.0 ppb, and 50–60 Å at 10 ppb, for example. As can be clearly observed in the figure, the relationship of the amount of Fe added (similarly with the amount of other metallic substances added) is in proportion with the average roughness Ra after the etching process, and it can be observed that the average roughness Ra depends on the amount of the metallic substance added. Accordingly, the average roughness Ra can be controlled very precisely and accurately by precisely controlling the amount of the metallic substance added.

Figure 8:
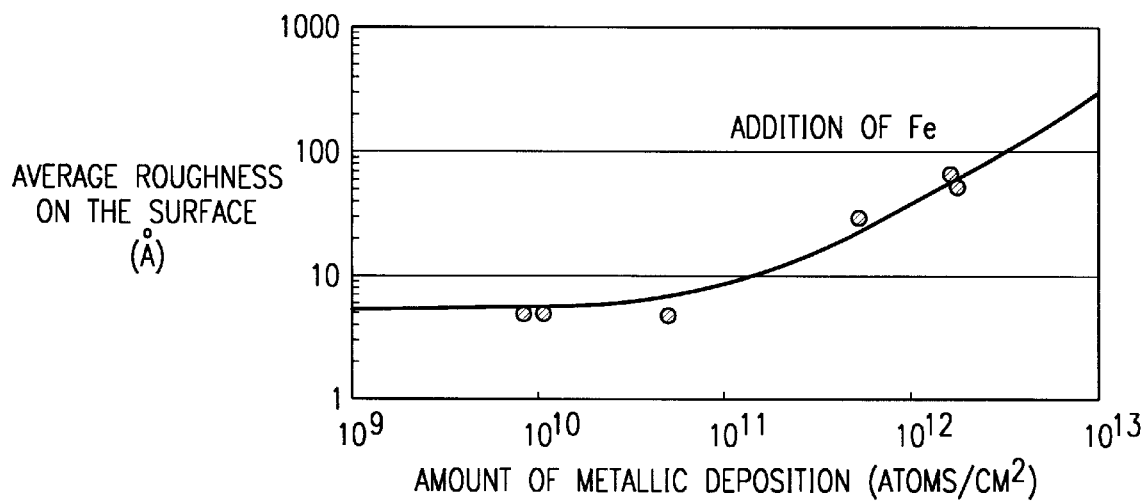
FIG. 8 is a graph indicating the relationship between the amount of metallic (Fe) deposition on the Si layer and the average roughness on the surface of the layer.

Next, FIG. 8 is a graph indicating the relationship between the number of Fe deposited (atoms/$cm^2$) on the surface of the Si layer after cleansing and the average roughness Ra (Å) after the CDE process. To explain the average roughness Ra, Ra is approximately 4 Å when the amount of Fe deposited is approximately $7 \times 10^{10}$ (atoms/$cm^2$), and Ra increases linearly on a logarithmic scale when exceeding $10^{11}$ (atoms/$cm^2$). For instance, Ra is 20–30 Å when the amount of metallic deposition is $7 \times 10^{11}$ (atoms/$cm^2$) and approximately 60 Å at $10^{12}$ (atoms/$cm^2$).

As can be clearly observed above, Ra is dependent on the amount of Fe deposited on the surface of the Si layer and also increases in proportion to the amount of metallic deposition. Accordingly, Ra can be controlled very precisely and accurately by properly controlling the amount of metallic deposition on the surface of the Si layer. The amount of metallic deposition can be controlled and adjusted precisely by the ppb level of the amount of metal added in the cleansing solution.

EXAMPLE 2

Figure 9:
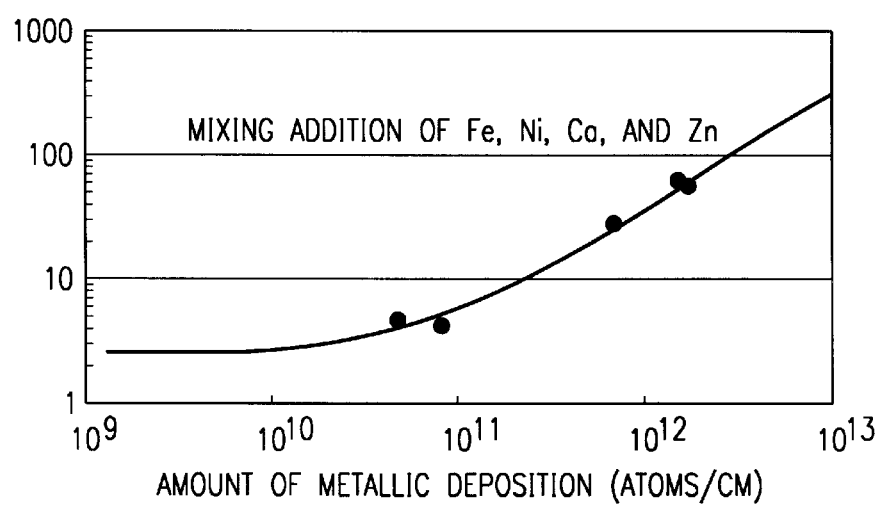
FIG. 9 is a graph, similar to FIG. 8, but indicating the relationship between the amount of metallic deposition when a mixture of (Fe, Ni, Cu, and Zn) is added and the average roughness of the surface of the Si layer.

FIG. 9, similarly to FIG. 8, also indicates the relationship between the amount of metallic deposition (atoms/$cm^2$) on the surface of the Si layer after cleansing and Ra after the CDE process. The metallic substances to be added to the cleansing solution SC1 in this example are a mixture of Fe, Ni, Cu, and Zn.

The same results as the experiment in FIG. 8 are also obtained in the experiment indicated in FIG. 9. There is the tendency for Ra to increase linearly in proportion to the amount of metallic deposition.

The relationship between Ra and the effect in an increase in the surface area of the substrate (i.e. the Si layer 20), which is the effect in the enlargement of the surface, by this manufacturing method will be explained next based on the results of said experiments.

More precisely, the rate of area increase of an ideal plane by this process is +0.2% when Ra is 4–5 Å, +7.1% when Ra is 30, and +22% when Ra is 60 Å. As can be understood from this, an enlargement of the surface can be attained by properly selecting and establishing the Ra.

Next, FIG. 10 indicates an example of a trench type DRAM cell structure adopting the manufacturing method of this invention, in which the side walls of the trench 210 carved in the Si substrate 20 are roughened by the formation of irregularities 211, etc., at the Å level through said cleansing process and each of the CDE processes. A dielectric film 212 is formed over the trench walls formed with these irregularities 211, etc. A plate layer 213 of poly-Si is formed over this dielectric film 212 to form the cell structure shown in the figure.

FIG. 11(a)–(c) indicate each of the examples in which the manufacturing method of this invention is adapted to the stack type cell structure. In FIG. 11(a), the surface of a fin 220, formed on the surface area of the Si substrate 20, is roughened with the formation of irregularities 221, etc., a dielectric film 222 is formed, and a poly-Si plate layer 223 is formed as well. In FIG. 11(*b*), the fin 220 is formed as two layers, irregularities 221, etc., are formed on the surface of these two fins 220 and 220, and a poly-Si plate layer 223 is then formed on top with a dielectric layer 222 in between.

Also in FIG. 11(*c*), a nearly U-shaped fin 240, is formed on the Si substrate 20, the surface is roughened with irregularities 241), etc., and a plate layer 243 formed from poly-Si is formed with a dielectric film 242 in between.

When compared to a cell structure without the process of this invention, the capacity area increases drastically in all of the trench type cell structures in said FIG. 10 and the stack type cell structures in FIGS. 11(*a*)–(*c*), through an enlargement of the trench's inner wall surfaces and an enlargement of the fin surfaces.

The manufacturing method of this invention is not restricted to the cell structure of a DRAM but can be widely adapted to semiconductor devices in which an increase in capacity, for example, is necessary, by increasing the surface area through roughening of the surface.

The following effects can be obtained by employing the manufacturing method in accordance with the present invention.

1. Metallic substances are deposited at $10^3$–$10^{13}$ atoms/$cm^2$ by washing the surface of the Si layer on the substrate. A silicon oxide film containing metallic substances is then formed during a drying process, and Si is etched from the silicon oxide film at a high rate of selectivity during a following etching process. Therefore, the surface can be evenly roughened with a microscopic roughness at the Å level, and an increase in the surface area can be attained regardless of the shape of the Si film or Si layer on the surface area of the substrate.

2. The goal expected in this process can be attained only by adding a metallic substance during the cleansing process without complicating manufacturing processes and increasing the cost.

3. The level of the roughened surface is proportional to the amount of metallic deposition on the surface of the substrate. The amount of metallic deposition can be precisely and accurately controlled according to the amount of metallic substance (ppb level) added to the cleansing solution. Therefore, the level of the roughened surface can be precisely and accurately controlled with a microscopic roughness at the Å level with this control, and a highly precise roughening process can be attained.

What is claimed is:

1. A method for imparting microscopic irregularities to the surface of a layer of semiconductor material in a process for manufacturing a semiconductor device, said method comprising:

immersing a substrate having at least a layer of semiconductor material thereon in a cleansing solution having metallic substances at the atomic level dispersed therein for washing the substrate;

depositing the metallic substances from the cleansing solution onto the surface of said layer of semiconductor material in response to the immersion of said substrate having said layer of semiconductor material thereon in the cleansing solution having the metallic substances dispersed therein;

removing the substrate having said layer of semiconductor material thereon with the deposited metallic substances on the surface of said layer of semiconductor material from the cleansing solution;

drying the substrate having said layer of semiconductor material thereon with the deposited metallic substances on the surface of said layer of semiconductor material;

forming a semiconductor oxide film containing said metallic substances on top of said layer of semiconductor material on said substrate in response to the drying of said substrate having said layer of semiconductor material thereon with the deposited metallic substances on the surface of said layer of semiconductor material;

exposing said oxide film to an etchant which breaks the bonds between said metallic substances and said layer of semiconductive material allowing the semiconductor material underneath said metallic substances to be selectively etched at a rate faster than surrounding semiconductor oxide.

2. A method as set forth in claim 1, wherein the selective etching is accomplished by isotropic etching.

3. A method as set forth in claim 1, wherein the selective etching is accomplished by anisotropic etching.

4. A method as set forth in claim 1, wherein the metallic substances at the atomic level dispersed in the semiconductor substrate cleansing solution include one or more metallic substances taken from the group consisting of Fe, Ni, Cu, Zn, Al, and Cr.

5. A method as set forth in claim 1, further including adding particles including at least one metallic substance at the atomic level to a semiconductor substrate cleansing solution to provide a semiconductor substrate cleansing solution having metallic substances at the atomic level dispersed therein prior to the immersion of the substrate having at least a layer of semiconductor material thereon in the cleansing solution.

6. A method as set forth in claim 5, wherein the particles added to the semiconductor substrate cleansing solution include one or more metallic substances at the atomic level taken from the group consisting of Fe, Ni, Cu, Zn, Al, and Cr;

the amount of the metallic substances added to the semiconductor substrate cleansing solution being in the range of 0.1–1000 ppb (parts per billion).

7. A method as set forth in claim 1, further including embedding the metallic substances in the semiconductor oxide film as metallic oxides as the semiconductor oxide film is being formed in response to the drying of said substrate having said layer of semiconductor material thereon with the deposited metallic substances on the surface of said layer of semiconductor material.

8. A method as set forth in claim 7, wherein the layer of semiconductor material on the substrate is a silicon layer;

the formation of the semiconductor oxide film in which the metallic substances are embedded as metallic oxides comprises forming a silicon oxide film in which the metallic substances are embedded as metallic oxides on the silicon layer on the substrate.

9. A method as set forth in claim 8, wherein the selective etching accomplishes the etching of silicon from the silicon oxide film; and the formation of microscopic irregularities on the surface of the silicon layer is in response to the continued selective etching of silicon from the silicon oxide film until the silicon oxide film is essentially removed.

10. A method as set forth in claim 9, wherein the silicon oxide film containing embedded metallic oxides is formed on the surface of the silicon layer on the substrate with a thickness in the range of 2–10 Å.

11. A method as set forth in claim 10, wherein the microscopic irregularities formed on the surface of the silicon layer in response to the continued selective etching of silicon from the silicon oxide film until the silicon oxide film is essentially removed have a roughness factor at a peak-to-peak value of approximately 400 Å.

12. A method as set forth in claim 5, wherein the metallic substances added to the semiconductor substrate surface are the range of $10^3$–$10^{13}$ atoms/cm$^2$.

* * * * *